United States Patent [19]
Inaba

[11] Patent Number: 5,144,161
[45] Date of Patent: Sep. 1, 1992

[54] LOGIC CIRCUIT FOR SWITCHING NOISE REDUCTION

[75] Inventor: Takeshi Inaba, Tokyo, Japan

[73] Assignee: Oki Electric Industry Co., Ltd., Tokyo, Japan

[21] Appl. No.: 669,506

[22] Filed: Mar. 14, 1991

[30] Foreign Application Priority Data

Mar. 16, 1990 [JP] Japan ................................. 2-65913

[51] Int. Cl.$^5$ ............................................. H03K 17/16
[52] U.S. Cl. .................................... 307/443; 307/452; 307/473
[58] Field of Search ............... 307/443, 473, 451, 452, 307/592, 594, 597

[56] References Cited

U.S. PATENT DOCUMENTS

| | | | |
|---|---|---|---|
| 4,877,978 | 10/1989 | Platt | 307/452 |
| 4,961,010 | 10/1990 | Davis | 307/443 |
| 5,034,637 | 7/1991 | Jungert | 307/443 |
| 5,036,222 | 7/1991 | Davis | 307/443 |

Primary Examiner—Eugene R. LaRoche
Assistant Examiner—Tan Dinh
Attorney, Agent, or Firm—Edward D. Manzo

[57] ABSTRACT

An improved logic circuit for switching noise reduction is disclosed. The logic circuit is provided between a voltage source line and a plurality of ground lines. The logic circuit according to the present invention changes connection to the ground line in response to a logic status change of an input signal by means of a switching circuit therein to isolate an input or output terminal from a switching noise on a predetermined ground line which tends to generate switching noise at the logic status change.

21 Claims, 9 Drawing Sheets

LOGIC CIRCUIT FOR SWITCHING NOISE REDUCTION

REFERENCE TO RELATED APPLICATIONS

This application claims the right of priority under 35 U.S.C. 119 of Japanese Patent Application Serial No. 65913/90, filed on Mar. 16, 1990, the entire disclosure of which is incorporated herein by reference.

BACKGROUND OF THE INVENTION

1. Field of the invention

This invention relates to an improved logic circuit for switching noise reduction, which is suitable for an integrated circuit logical data input or output circuit having a plurality of input terminals or output terminals whose logic status changes at fast speed, independently of each other.

2. Brief description of the related art

In the field of logic circuitry, especially input or output operations in an integrated circuit, such as a microprocessor, there has been a need for a faster and error free data input or data output circuit.

However, faster input/output operations in the data input or data output circuits generally cause more data errors. The cause of such data errors may be explained in the following examples.

FIG. 1 illustrates a general block diagram of an example of a conventional output buffer circuit 2 utilized in a microprocessor (not shown). In this example, a plurality of three-state output buffer circuits 8-1, 8-2, ... 8-n (n:integer, n>2) are provided between a common voltage source line 4 which is connected to a voltage source Vcc (+5 V) and a common ground line 6 which is connected to a ground level Vss.(0 V)

Each of the three-state output buffer circuits 8-1, 8-2, ... 8-n receives one corresponding input data signal IN-1, IN-2, ... IN-n respectively, which has either a "H" (+5 V) level or "L" (0 V) level. Further, the three-state output buffer circuits 8-1 to 8-n output the input data signals to output terminals 10-1, 10-2 ... 10-n thereof respectively in response to each of corresponding "H" level data control signals CS-1, CS-2, ... CS-n.

On the other hand, in case that the data control signals CS-1, CS-2, ... CS-n have a "L" (0 V) level, the three-state output buffer circuits 8-1, 8-2, ... 8-n enter a high impedance state.

Because the three-state output buffer circuits 8-1, 8-2, ... 8-n operate independently of each other, switching noise is generated in the following condition.

Assume that all of the data control signals CS-1 to CS-n at a "H" level,(2) (1) all of the input data signals IN-1 to IN-n except IN-n become "L" level from the previous at a "H" level, (3) and only the input data signal IN-n maintains its "L" level in the same timing.

In this condition, the three-state output buffer circuits 8-1, 8-2, ... 8-n except one output buffer circuit 8-n outputted "H" level signals and positive electric charges were charged in the output terminals 10-1, 10-2, ... 10-(n−1). If the three-state output buffer circuits 8-1, 8-2, ... 8-(n−1) output "L" level signal simultaneously, all of those positive electric charges flow into the common ground line 6 and generate an inductive switching noise on the common ground line 6. The switching noise further generates a derived switching noise on the output terminal 10-n which must maintain its, "L" level status.

FIG. 2 illustrates the signal conditions of the output terminals 10-1, 10-2, ... 10-n under above mentioned situation. In FIG. 2, a signal status A illustrates signal status of the output terminals 10-1, 10-2, ... 10-(n−1) and a signal status B illustrates signal status of the output terminal 10-n. At the output terminal 10-n, a switching noise NZ-1 appears at the falling edge of the signal status A shown as waveform B in FIG. 2. Such switching noise NZ-1 can cause data error of the output buffer circuit 2.

Further, similar phenomenon could be appear in case of a data input circuit if the data input circuit has a similar circuit structure to that of the output buffer circuit 2. For example, if the data input circuit comprises a plurality of input buffer circuits which are provided between a common voltage source line and a common ground line, operating independently of each other, such switching noise could appear on an input terminal of one of the data input circuits under the above mentioned condition.

To avoid such problems, there were some known modifications. One of the simplest ways to eliminate such switching noise is to prepare respective ground lines for respective output or input circuits to conduct the switching noise away. However, for an integrated circuit on a silicon substrate which must conserve space, it is wasteful and impractical to prepare such ground lines for each of the buffer circuits.

The other usual way to suppress such switching noise is to include a capacitance load for absorbing the switching noise at the output terminals. However, if possible, such loads should be eliminated for saving cost and space in an integrated circuit. Therefore, attention is given to the as to circuit structure itself for switching noise reduction.

FIG. 3 and FIG. 4 are drawings for explaining an example of such modifications utilized in an output buffer circuit for a microprocessor. Assume that an output buffer circuit 12 illustrated in FIG. 3 is one of the three-state output buffer circuits 8-1 to 8-n illustrated in FIG. 1. The output buffer circuit 12 is provided between a common voltage source line 14 which is connected to a voltage source Vcc (+5 V) and a common ground line 16 which is connected to a ground level Vss (0 V).

The output buffer circuit 12 includes a NAND gate 24 which receives an input signal IN-x (x:integer, 0<x≦n) via an input signal line 20 and a control signal CS-x via a control signal line 22, a NOR gate 30 which receives the input signal IN-x and an inverted control signal CS-x via an inverter 28. An output of the NAND gate 24 is applied to a gate terminal of a P-channel type MOS (hereinafter, PMOS) transistor 26 whose drain terminal is connected to the common voltage source line 14 and whose source terminal is connected to an output terminal 18 of the output buffer circuit 12.

Further, there are provided five n-channel type MOS (hereinafter, NMOS) transistors 32-1, 32-2, 32-3, 32-4, and 32-5 in parallel between the common ground line 16 and the source terminal of the PMOS transistor 26. In detail, all of the drain terminals of the NMOS transistors from 32-1 to 32-5 are connected to the source terminal of the PMOS transistor 26, and all of the source terminals of the NMOS transistors from 32-1 to 32-5 are connected to the common ground line 16.

Further, an output of the NOR gate 30 is applied to a gate terminal of the first NMOS transistor 32-1 and also applied to the other gate terminals of the other (second to forth) NMOS transistors from 32-2 to 32-5 gradually delayed by four delay circuits 34-1, 34-2, 34-3, and 34-4. The delay circuit itself is a conventional circuit and it could be possible to provide such delay circuit by means of a plurality of (as an even number) of serially connected inverter circuits or a conventional time constant circuit.

As a result, the output buffer circuit 12 outputs a logic status of an inputted signal IN-x on the input signal line 20 to an output terminal 18 in response to a "H" level control signal CS-x applied via the control signal line 22. If the control signal CS-x is "L" level, the output buffer circuit 12 becomes high impedance status.

Further, since a switching timing provided by the NOR gate 30 is delayed respectively by the delay circuits 34-1 to 34-4, any switching noise is also delayed gradually and suppressed enough to avoid a data error.

FIG. 4 is a drawing for explaining an effect of the modification provided in the output buffer circuit 12 illustrated in FIG. 3 and illustrates a similar situation to that of FIG. 2.

For example, even if the other output buffer circuits (not shown) change their output signal from "H" level to "L" level and only the output buffer circuit 12 maintain its "L" level, the positive electric charges flow into the common ground line 16 and will be diffused by the delay circuits. As a result, the inductive noise will be suppressed.

In FIG. 4, status C is a signal status of the output terminals of the other output buffer circuits (not shown) and status D is a signal status of the common ground line 16. As shown in FIG. 4, a switching noise NZ-2 is diffused during a switching timing T. As a result, its wave height is suppressed enough to avoid a data error.

However, the above mentioned modification has the disadvantage of needing a plurality of NMOS transistors and delay circuits for each of output buffer circuits. For an integrated circuit which must conserve space, it is a serious disadvantage. Further, because there are a plurality of NMOS transistors and delay circuits to be coupled, the switching time T of the output buffer circuit 12 itself becomes extremely long. Therefore, the modification could not be applied to a high speed output buffer circuit. Further, even the wave height is low, there still remains a switching noise (FIG. 4, curve D).

OBJECTS AND SUMMARY OF THE INVENTION

An object of the present invention is to provide an improved input or output circuit having a switching noise reduction function to solve above-mentioned disadvantages.

Another object of the present invention is to realize such input or output circuit by combining several electric parts to be suitable for an integrated circuit.

The present invention provides an improved logic circuit switching noise reduction including a voltage source line for applying a power source potential, a plurality of ground lines for applying a ground level, a selecting circuit connected to the ground lines respectively for selecting one of the ground lines after a predetermined delay in response to an input signal whose logic level varies, and a logic circuit connected to said voltage source line and said selecting circuit and driven by a potential between the power source potential and the ground level, the logic circuit outputting a logic signal in response to the input signal.

The logic circuit according to the present invention switches the ground lines in response to level changes of the input signal. Therefore, as a result, an inductive noise caused by flowing electric charges from a group of the logic circuits is conducted into each of predetermined ground lines separately depending on the level of the input signal.

Further scope and applicability of the present invention will become apparent from the detailed description given hereinafter. However, it should be understood that the detailed description and specific examples, while indicating preferred embodiments and the invention, are given by way of illustration only, since various changes and modifications within the spirit and scope of the invention will become apparent to those skilled in the art from this detailed description.

BRIEF DESCRIPTION OF THE DRAWINGS

These and other features and advantages of the invention may be more completely understood from the following detailed description of the preferred embodiments of the invention with reference to the accompanying drawings in which.

DESCRIPTION OF THE PREFERRED EMBODIMENT

We are explaining hereunder an example of an output buffer circuit according to the present invention using FIG. 5, FIG. 6, FIG. 7(a), and FIG. 7(b).

Figure 5:
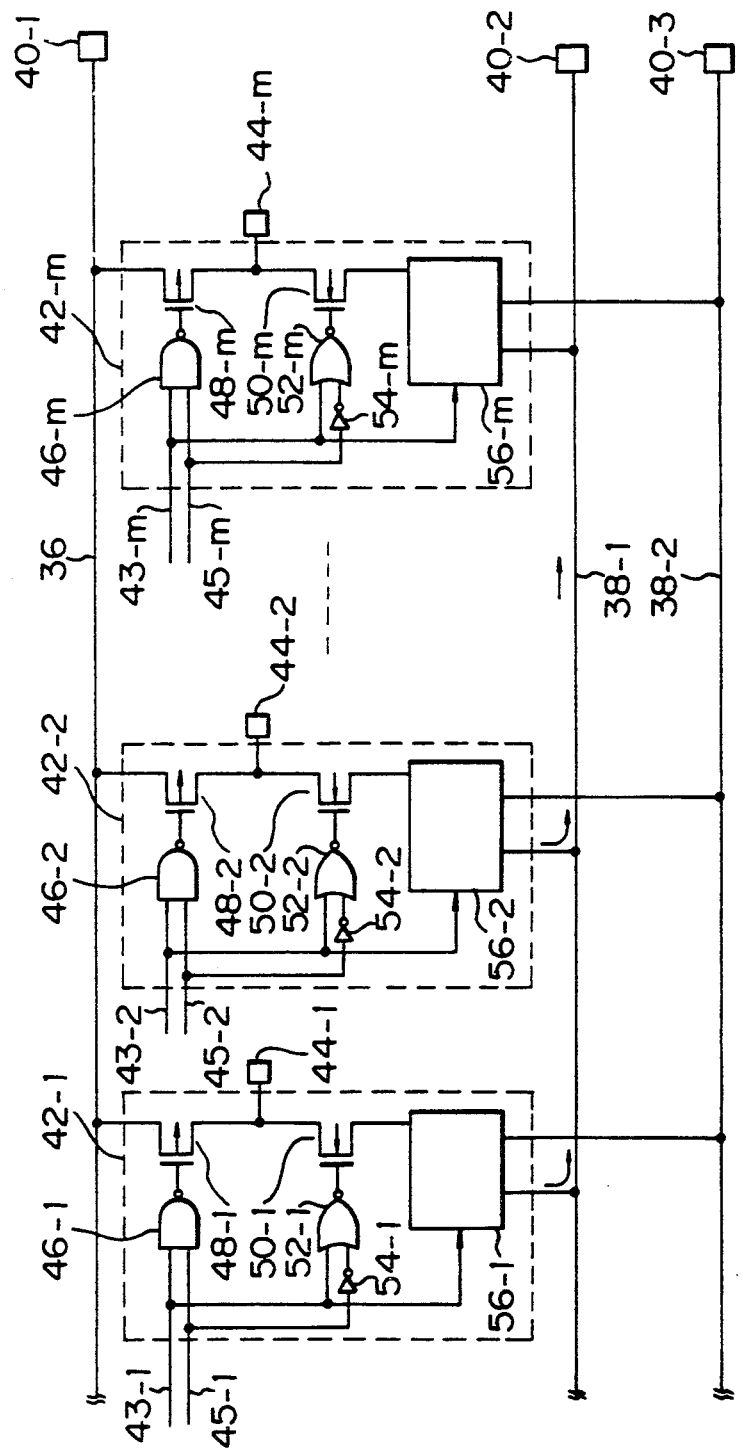
FIG. 5 illustrates an example of an output buffer circuit according to the present invention.

As shown in FIG. 5, the output buffer circuit according to the present invention comprises a plurality of three-state output buffer circuits 42-1, 42-2, . . . and 42-m (m;integer, m>2) provided between a common voltage source line 36 and two of common round lines 38-1 and 38-2. The common voltage line 36 is connected to a voltage source terminal 40-1 which applies a predetermined potential Vcc (+5 V) and two of the common ground lines 38-1 and 38-2 are connected to two respective ground terminals 40-2 and 40-3 which apply a ground level Vss (0 V).

The three-state output buffer circuits 4-1 to 42-m substantially the same circuit structure as each other. For ease of reference, the suffixes of indices that are in the drawings can be omitted from the description of one buffer circuit. Each of the three-state output buffer circuits from 42 includes each respective NAND gate which receives input signals via respective input line and receives a control signal via respective control line.

Further, each of the three-state output buffer circuits includes a respective NOR which receives the respective input signals and the respective inverted control signal via a respective inverter.

The output of each NAND gate is applied to a respective gate terminal of a respective PMOS transistors 42. Drain terminals of all of the PMOS transistors from 48-1 to 48-m are connected to the common voltage source line 36. The source terminal of the PMOS transistors 48 connected to a respective output terminals 44 of the three-state output buffer circuits 42.

The output of each NOR gate 52 is applied to a respective gate terminal of an NMOS transistors 50. The drain terminal of the NMOS 50 is connected to the respective output terminal 44. Each of the source terminals of the NMOS transistors 50 50-m is connected to a respective switching.

Further, the input signals on an input line 43 is applied to the respective switching circuits from circuit 56. The switching circuit select one of the common ground lines 38-1 and 38-2.

It will be understood that reference has been made to elements 43, 44, 45, 46, 48, 50, 52, 54, and 56. Each buffer 442 includes one such element, so that any buffer 42-x includes elements 43-x, 44-x, ... 56-x connected as aforesaid. In FIG. 5, however, there is one voltage source line 36 and two ground lines 38-1 and 38-2.

Figure 6:
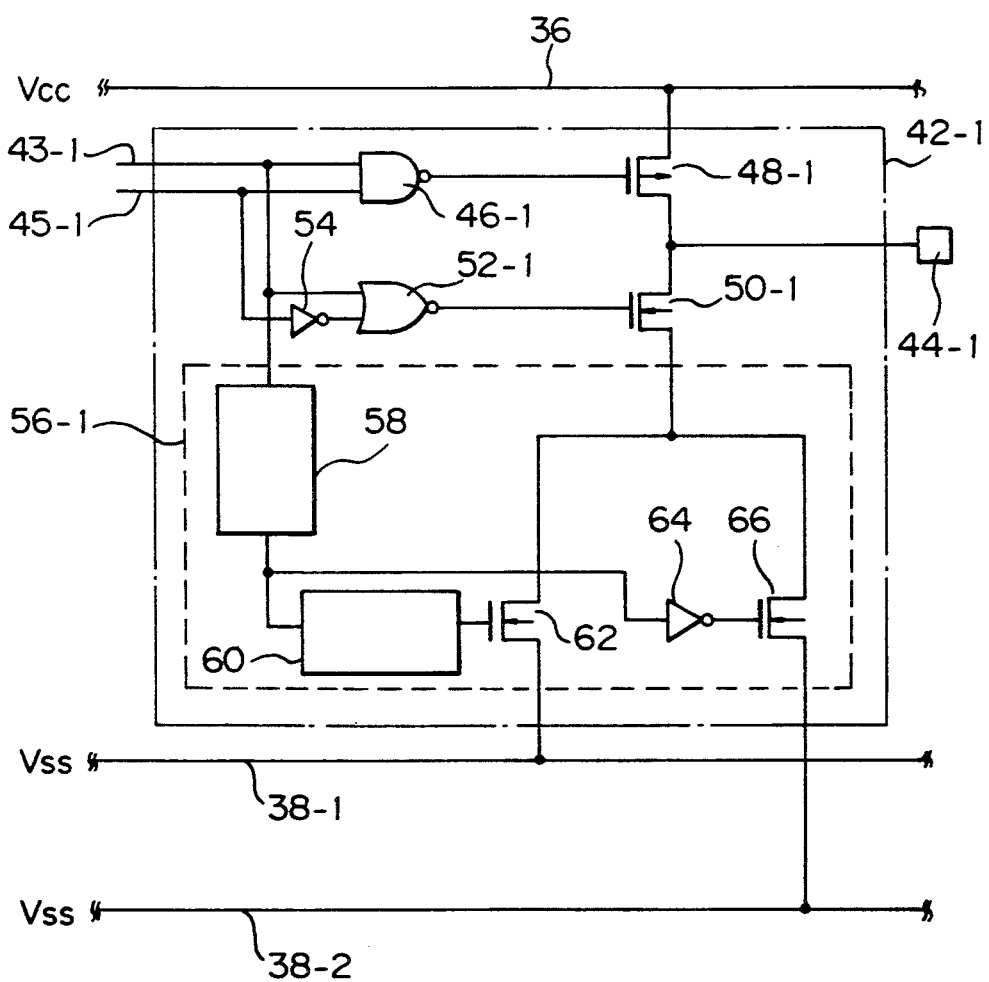
FIG. 6 is a detailed circuit diagram of a three-state output buffer circuit 42-1 illustrated in FIG. 5.

FIG. 6 is a representative drawing for explaining detailed contents and functions of the three-state output buffer circuits from 42-1 to 42-m. Output buffer circuit 42-1 is taken as a representative example.

As shown in FIG. 6, the source terminal of the NMOS transistor 50-1 (hereinafter, a first NMOS transistor 50-1) is connected to a drain terminal of a NMOS transistor 66 (hereinafter, a second NOMS transistor 66) whose source terminal is connected to the common ground line 38-2. Further, the source terminal of the first NMOS transistor 50-1 is also connected to a drain terminal of a NMOS transistor 62 (hereinafter, a third NOMS transistor 62) whose source terminal is connected to the common ground line 38-1.

Figure 7A:
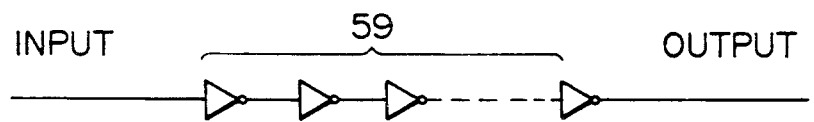
FIG. 7(a) and FIG. 7(b) are drawings for explaining contents of the delay circuits 58 and 60 illustrated in FIG. 6.
Figure 7B:
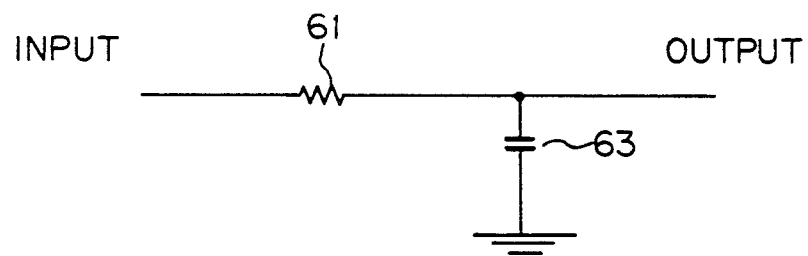

Those second and third NMOS transistors 62 and 66 are used for selecting common ground lines 38-1 and 38-2 respectively. To control the second NMOS transistor 66, the input signal on the input line 43-1 is applied to a first delay circuit 58 and comes to the gate terminal of the second NMOS transistor 66 via an inverter 64. Further, to control the third NMOS transistor 62, the input signal is applied to a gate terminal of the third NMOS transistor 62 via the first delay circuit 58 and a second delay circuit 60. The first and second delay circuit 58 and 60 could be comprised of an even number of inverter circuits 59 as illustrated in FIG. 7(a) or could be comprised of a predetermined time constant circuit comprising a resistor 61 and a capacitor 63 such as illustrated in FIG. 7(b). The amount of delay time could be designed to satisfy necessary switching time of the output buffer circuit 42-1.

Figure 8:
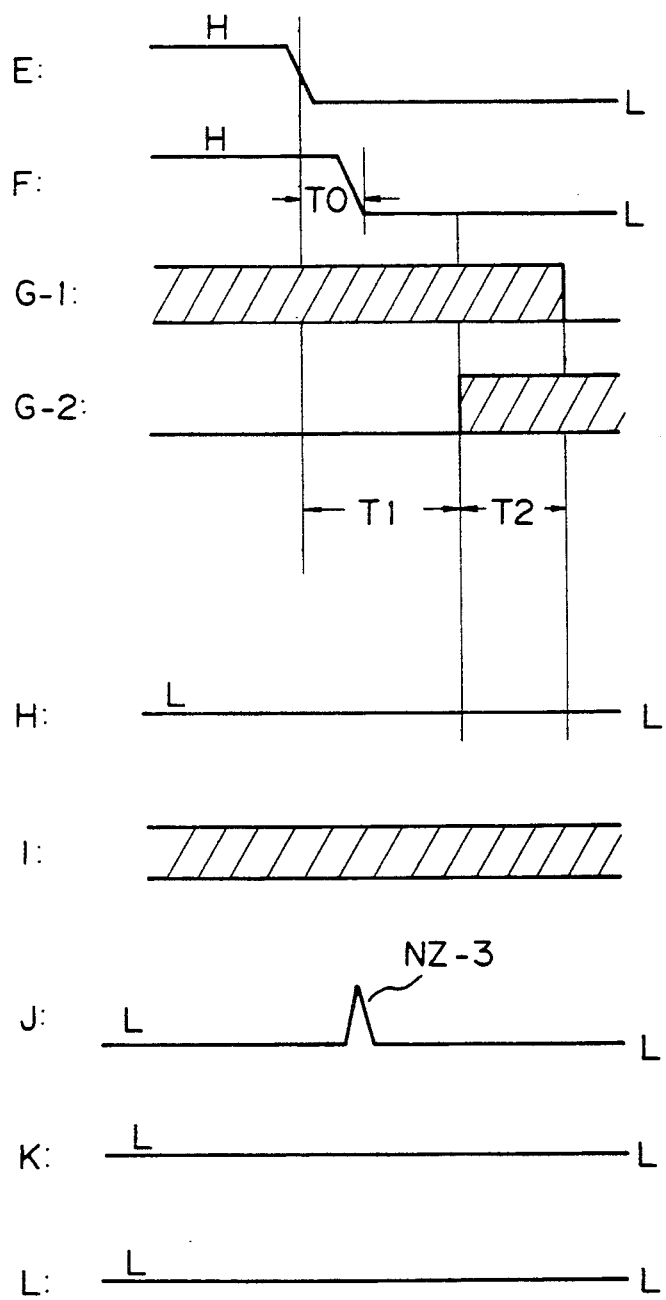
FIG. 8 illustrates several signal timings and signal condition of the embodiment illustrated in FIG. 5.

FIG. 8 illustrates several timings and status of the three-state output buffer circuit according to the present invention. Assume that there are provided a plurality of three-state output buffer circuits from 42-1 to 42-m and all of the three-state output buffer circuits from 42-1 to 42-(m−1) except one three-state output buffer circuit 42-m become "L"ow level from the previous "H"igh level while all of control signals on the control lines from 45-1 to 45-m are "H"igh level. Accordingly, assume that the three-state output buffer circuit 42-m remains (outputs) its "L"ow level status.

We are comparing signal status of one of the representative three-state output buffer circuits 42-1 which becomes "L" level from the previous "H" level and a representative three-state output buffer circuit 42-m (not shown) which maintains its "L" level using a common representative drawing FIG. 6.

At first, as illustrated as a signal status E in FIG. 8, an input signal at the input line 43-1 becomes "L" level from "H" level. Assume that the rest of the input signals on the input signal lines 43-2 to 43-(m−1) make the same transition as E.

On the other hand, assume that the input signal on the input signal line 43-m of the representative three-state output buffer circuit 42-m (not shown) maintain its "L" level.

As illustrated as a signal status F in FIG. 8, in response to the level change of the input signal, the three-state output buffer circuit 42-1 outputs "L" level signal from its output terminal 44-1 after a switching delay T0. In the previous "H" level interval of the input signal, two of the delay circuits 58 and 60 have already transferred the "H" level signal to the gate terminal of the third NMOS transistor 62. Therefore, the third NMOS transistor 62 in the three-state output buffer circuit 42-1 was "ON" at the previous "H" level status. On the other hand, the second NMOS transistor 66 received a "L" level signal at the gate terminal thereof via the inverter 64 and was turned "OFF" in the previous "H" level interval of the input signal. Of course, the first NMOS transistor 50-1 was turned "OFF" like a conventional three-state output buffer circuit. As a result, the output terminal 44-1 is isolated from both of the common ground lines 38-1 and 38-2 and becomes "H" level, because the PMOS transistor 48-1 turns "on"and pulls up its source terminal toward Vcc (or whatever voltage is impressed on line 36.

Status G-1 shows connecting status between the third NMOS transistor 62 in the three-state output buffer circuit 42-1 and the common ground line 38-1. A hatched portion in its status G-1: means an interval that the third NMOS transistor 62 receives "H" level signal via its gate terminal and has "ON" status.

Similarly, status G-2 shows connecting status between the second NMOS transistor 66 in the three-state output buffer circuit 42-1 and the other common ground line 38-2. A hatched portion in the status G-2 means an interval that the second NMOS transistor 66 receives "H" level signal at its terminal thereof via the inverter 64 and is turned "ON".

As shown in status G-1, the "L" level signal is delayed by the first delay circuit 58 for a first delay interval T1 and the "L" level signal is further delayed by the second delay circuit 60 for a second delay interval T2.

On the other hand, as shown as status H:, in the three-state output buffer circuit 42-m (not shown), its input signal is maintaining "L" level. Therefore, as a result, the first NMOS transistor 50-m and the second NMOS transistor 66 in the three-state output buffer circuit 42-m (not shown) maintain "ON" status and the output terminal 44-m is grounded to the common ground line 38-2. Status I shows a connecting status between the second NMOS transistor 66 and the common ground line 38-2. The hatched portion in the status I means an interval that the second NMOS transistor 66 in the three-state output buffer circuit 42-m (not shown) receives "H" level signal at the gate terminal thereof via the inverter 64 and is "ON" status.

In short, if the input signal maintains a static "H" level, the first NMOS transistor 50-1 becomes "OFF," and the second NMOS transistor 66 becomes "OFF" and the third NMOS transistor 62 turns "ON" so that the ground line 38-1 is connected to the output buffer circuit 42-1. Further, if the input signal maintains a static "L" level, the first NMOS transistor 50-1 becomes "ON," and the second NMOS transistor 66 becomes "ON," and the third NMOS transistor 62 becomes "OFF" so that common ground line 38-2 is connected to the output buffer circuit 42-1.

If the three-state output buffer circuits 42-1 to 42-(m−1) become "L" level, they are still connected to the common ground line 38-1 during the first delay interval T1 and the second delay interval T2. During the switching interval T0, all of positive electric charges charged on output terminals 44-1 to 44-(m−1) are conducted to the common ground line 38-1 and cause a switching noise on the common ground line 38-1 as illustrated as status J which represents a signal status on the common ground line 38-1 in FIG. 8.

However, even the switching noise NZ-3 is appeared on the common ground line 38-1, the other common ground line 38-2 is isolated from the switching noise as illustrated as status K which represents a signal status on the common ground line 38-2 and maintains its "L" level. Therefore, as a result, there is no derived noise on the output terminal 44-m as illustrated as status L which represents a signal status the output terminal 44-m.

The three-state output buffer circuit 42 is connected to the common ground line 38-1 while the input signal remains at an "H" level status. Furthermore, the buffer circuit is also connected to the common ground line 38-1 for the delay time T1 and T2, even if the input signal changes from the "H" level status to an "L" level status.

On the other hand, the three-state output buffer circuit 42 are connected to the common ground kine 38-1 while the input signal remains at an "H" level status. Furthermore, the buffer circuit is also connected to the common ground line 38-2 while the input signal while the input signal remains at an "L" level status. Furthermore, they will also be connected to the common ground line 38-2 for the delay time T1 and T2 even if the input signal changes from the "L" level status to an "H" level status."

The reason for providing the second delay circuit 60 is to prevent a condition that both of the second and the third NMOS transistors 62 and 66 are disconnected from any of the common ground lines 38-1 and 38-2. On the other hand, in a status that the output terminal 44-1 outputs "H" level signal, changing the common ground lines causes no problem because the first NMOS transistor 50-1 is "OFF" and thus isolates the output terminal 44 from both of the common ground lines 38-1 and 38-2.

Figure 1:
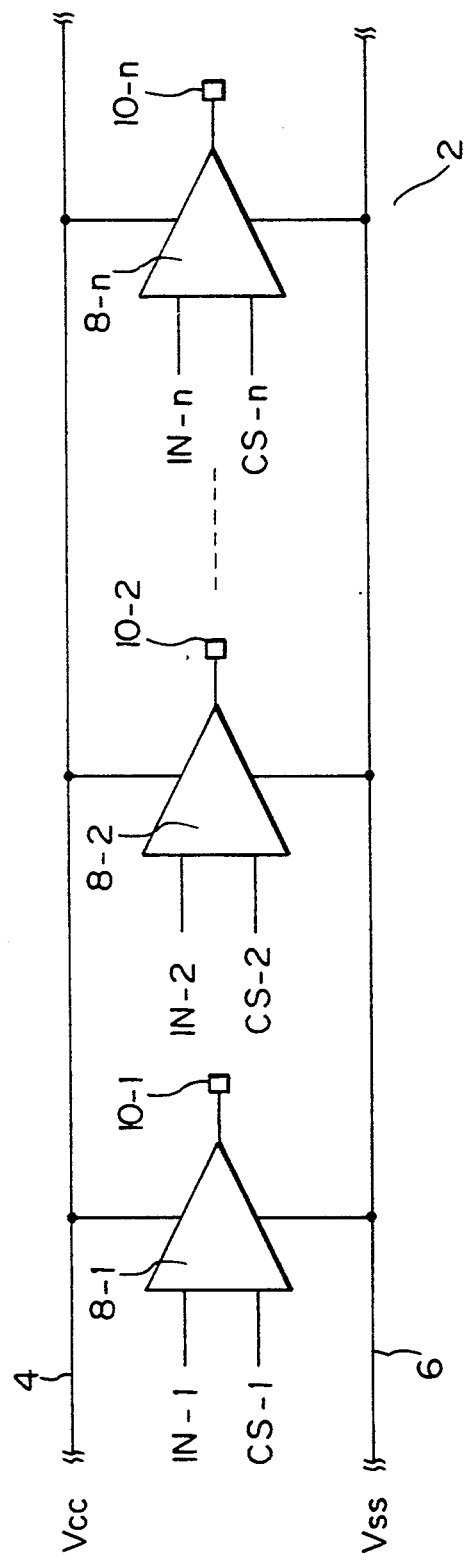
FIG. 1 illustrates a general block diagram of a conventional output buffer circuit.
Figure 2:
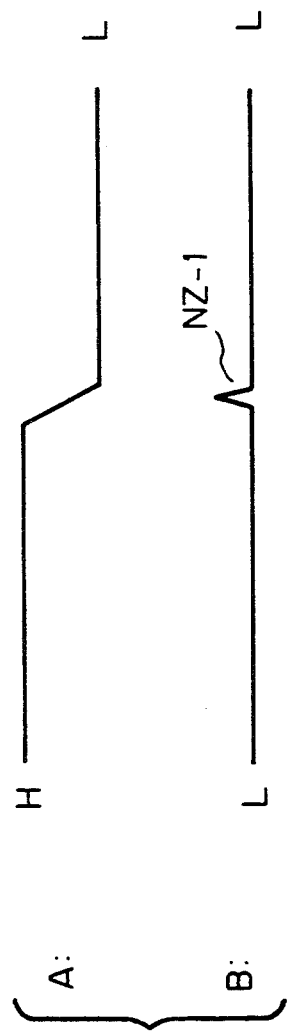
FIG. 2 illustrates a drawing for explaining how switching noise to generated on a common ground line in FIG. 1.
Figure 3:
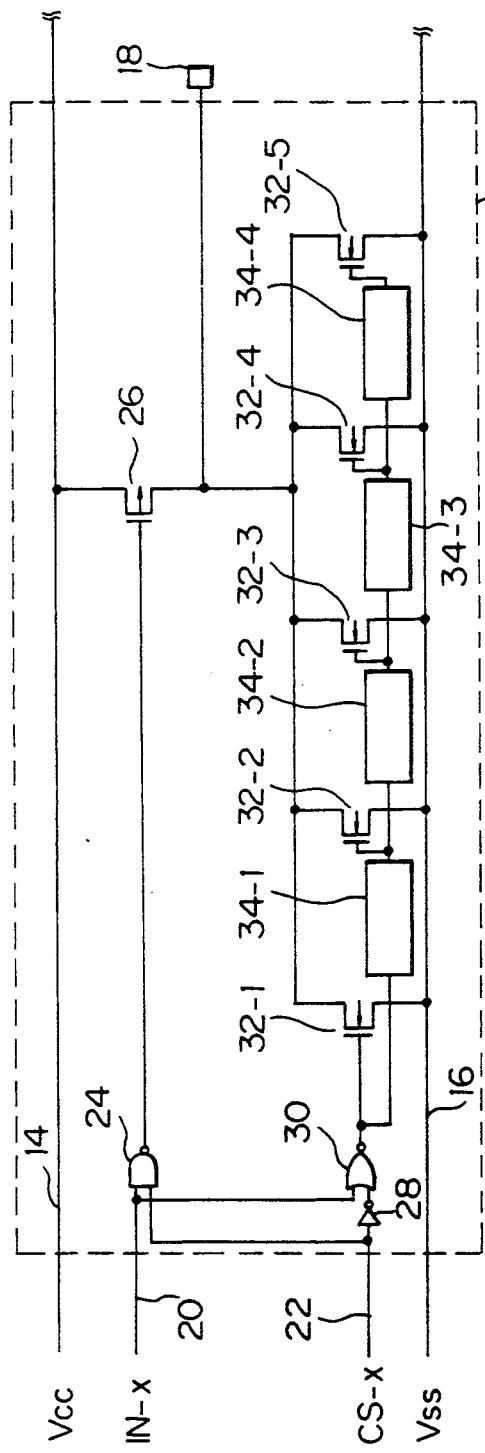
FIG. 3 illustrates a known modification of an output buffer circuit for switching noise reduction.
Figure 4:
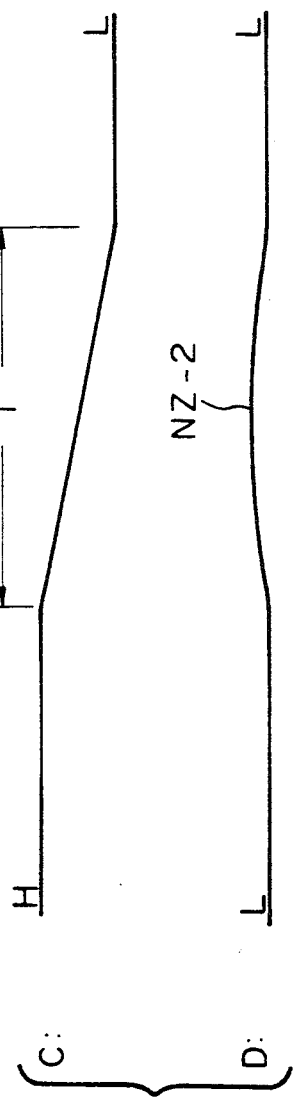
FIG. 4 illustrates a drawing for explaining a situation that a switching noise is surpressed in the output buffer circuit illustrated in FIG. 3.

According to this embodiment, the output terminal 44-m in the three-state output buffer circuit 42-m (not shown) is completely isolated from the common ground line 38-1 in which a switching noise is generated. Therefore, it can be possible to increase switching speed of each of the three-state output buffer circuits 42-1 to 42-m compare with the conventional modification illustrated in FIG. 3. Further compared with the simple circuit isolation method, the present invention needs fewer common ground lines and is more effective.

Figure 9:
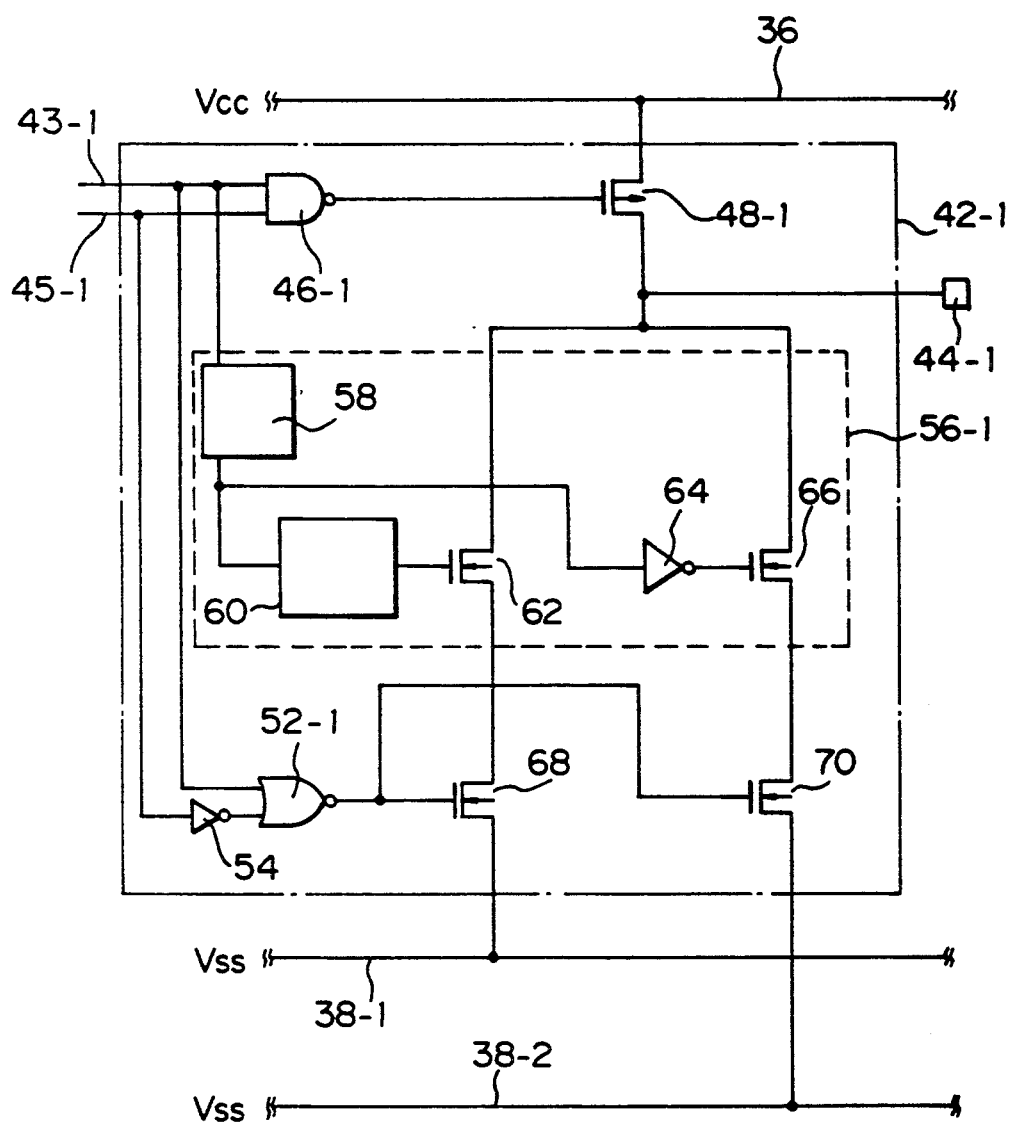
FIG. 9 illustrates a minor modification of the output buffer circuit illustrated in FIG. 6.

FIG. 9 illustrates a minor modification of the three-state output buffer circuit 42-1 illustrated in FIG. 6. In FIG. 9 and FIG. 6, the same reference numerals represent substantially the same parts.

In FIG. 9, there are two of NMOS transistors 68 and 70 instead of the first NMOS transistor 50-1, both of which are controlled by the NOR circuit 52-1 in parallel. According to the modification, the switching circuit 56-1 is isolated from or connected to the common ground lines 38-1 and 38-2 by the NMOS transistors 68 and 70 respectively and simultaneously.

According to this modification, it can be possible to obtain substantially the same effect of the embodiment illustrated in FIG. 6. This kind of modification can be acceptable within the scope of the present invention.

Further, the present invention is applicable to an input buffer circuit in which the switching noise should be eliminated.

Figure 12:
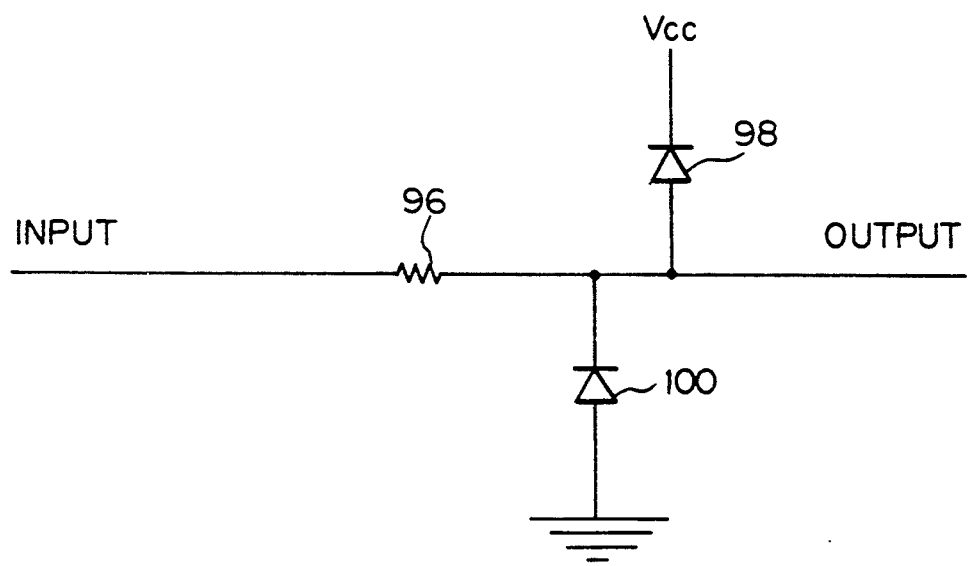
FIG. 12 illustrates an example of the contents of a protector circuit 76-1 illustrated in FIG. 11.
Figure 10:
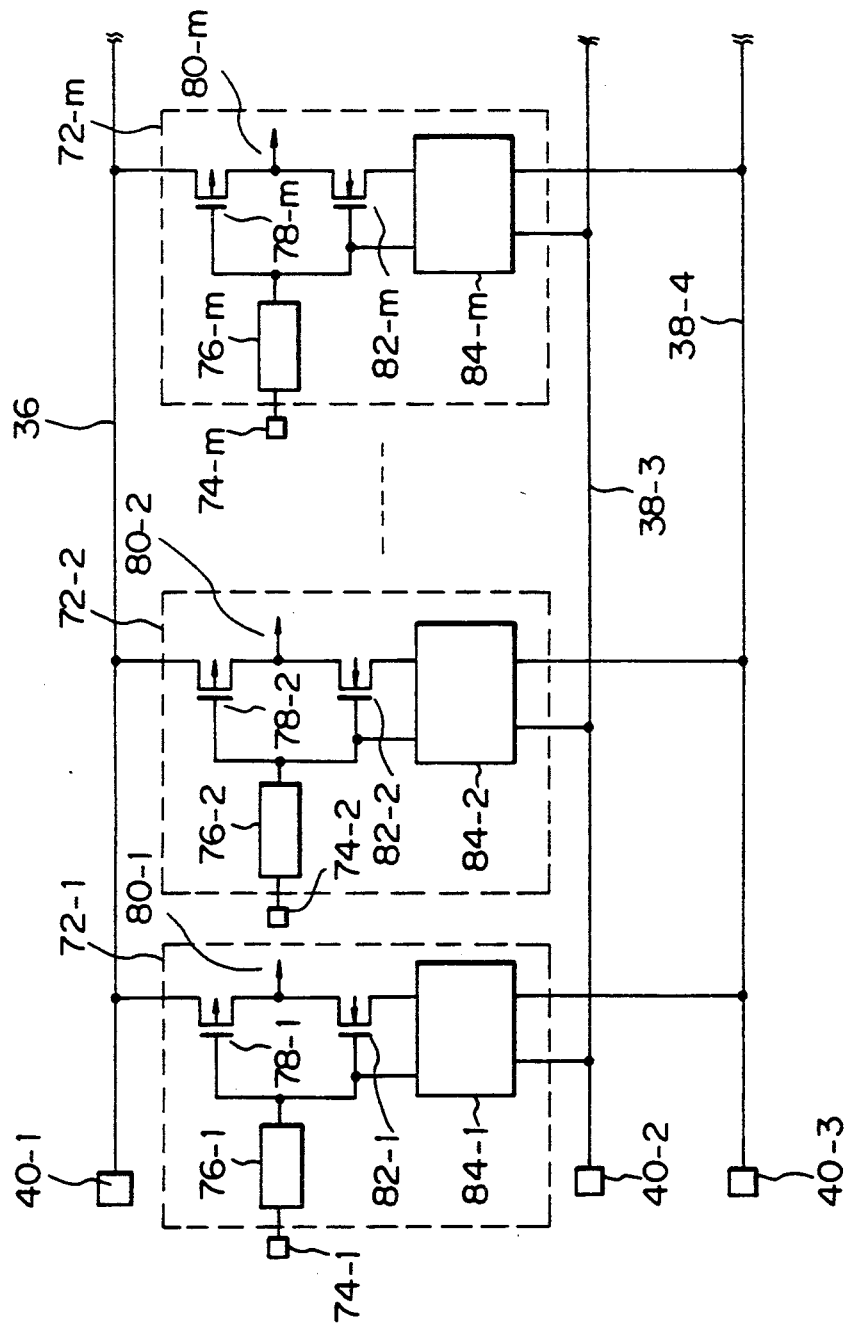
FIG. 10 illustrates an example of an input buffer circuit according to the present invention.
Figure 11:
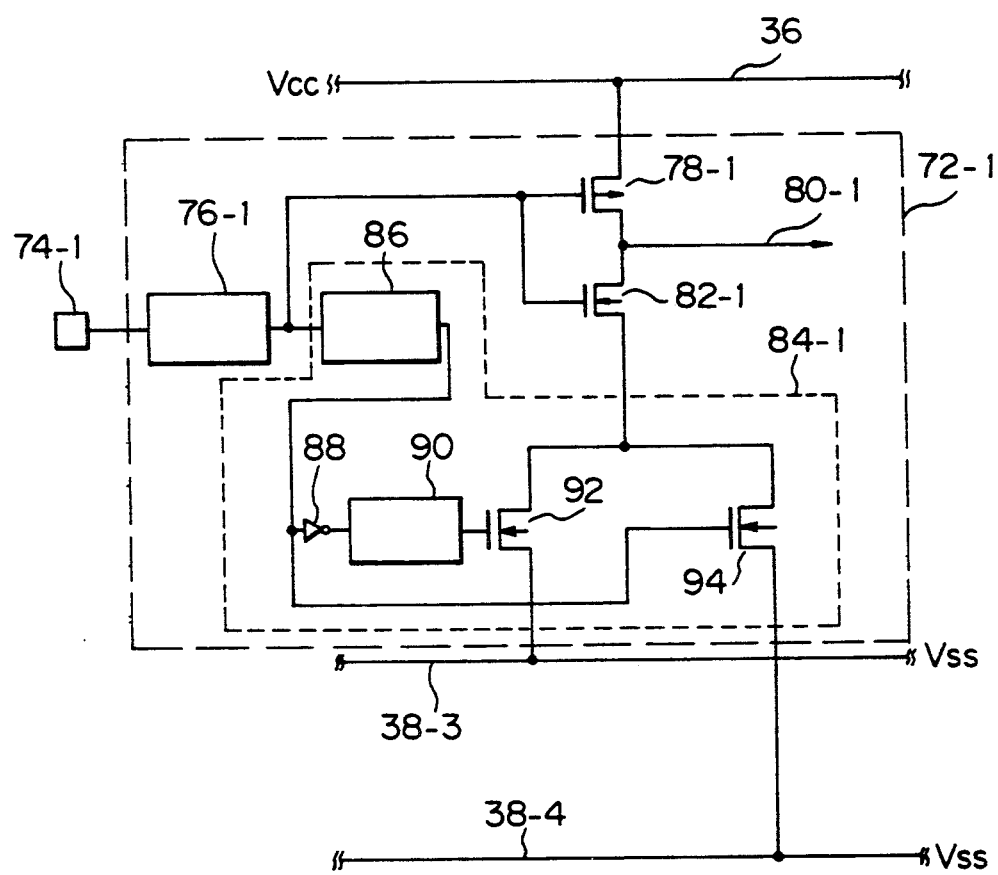
FIG. 11 is a detailed circuit diagram of an input buffer circuit 72-1 illustrated in FIG. 10.

FIG. 10, FIG. 11, and FIG. 12 illustrate such embodiment of the present invention. In those drawings, numerals from FIG. 5 or FIG. 6 represent substantially the same parts illustrated in FIG. 5 or FIG. 6.

As illustrated in FIG. 10, assume that the input buffer circuit comprises a plurality of individual negative logic input buffer circuits 72-1, 72-2, . . . 72-m (m;integer, m>2) provided between a common voltage source line 36 and a pair of common ground lines 38-3 and 38-4. The common voltage source line 36 is connected to a voltage source terminal, 40-1 which applies a predetermined potential Vcc (+5 V). The common ground lines 38-3 and 38-4 are connected to ground terminals 40-2 and 40-3 which apply a ground level (0 V) respectively. Each input buffer circuit from 72-1 to 72-m has substantially the same circuit structure.

The contents of those input buffer circuits is now set forth using a representative drawing FIG. 11, which illustrates the contents of the input buffer circuit 72-1. As shown in FIG. 11, the input buffer circuit 72-1 has an input terminal 74-1 to which an input signal from an outer circuit (not shown) is applied. The input signal is further applied to a protector circuit 76-1 for protecting the input buffer circuit from damages caused by voltage surges, noises, and the like.

The protector circuit 76-1 could be comprised of a conventional combination of a resistor 96 and a pair of diodes 98 and 100 illustrated in FIG. 12.

Further, the input signal is applied to gate terminals of a PMOS transistor 78-1 and a first NMOS transistor 82-1. A drain terminal of the PMOS transistor 78-1 is connected to the common voltage source line 36 and a source terminal of the PMOS transistor 78-1 is connected to an input signal line 80-1 applying negative logic status of the input terminal 74-1 to an inner circuit (not shown). A drain terminal of the first NMOS transistor 82-1 is also connected to the input signal line 80-1.

Further, there are provided a second NMOS transistor 94 and a third NMOS transistor 92 for respective connection to the common ground lines 38-3 and 38-4. Both of drain terminals of the second and third NMOS transistors are connected to a source terminal of the first NMOS transistor 82-1. A source terminal of the second NMOS transistor 94 is connected to one common ground line 38-4 and a source terminal of the third NMOS transistor 92 is connected to the other common ground line 38-3.

An "H" level input signal causes "OFF" status of the first PMOS transistor 78-1 and "ON" status of the first NMOS transistor 82-1. Further, the "H" level input signal comes to a first delay circuit 86 and to a gate terminal of a second NMOS transistor 94 to cause "ON" status of the second NMOS transistor 94. As a result, an input signal line 80-1 to an outer circuit (not shown) is electrically connected to the common ground line 38-4 via the first and second NMOS transistors 82-1 and 94 and thus is pulled down to "L" status.

On the other hand, the "H" level input signal from the first delay circuit 86 is inverted by an inverter, 88 and comes to a gate terminal of a third NMOS transistor 92 to turn "OFF" the third NMOS transistor 92.

An "L" level signal allows the PMOS transistor 78-1 to remain "ON" and turns the first NMOS transistor 82-1. Further, the delayed "L" level signal from the first delay circuit 86 causes an "OFF" status of the second NMOS circuit 94 and further causes an "ON" status of the third NMOS transistor 92 via the inverter 88 and the second delay circuit 90.

As a result, the input signal line 80-1 is pulled "H" level via FET 78-1 and the input buffer circuit 72-1 is connected to the common ground line 38-3 via the third NMOS transistor 92.

As explained in the "BACKGROUND OF THE INVENTION", the switching noise may be generated in a situation that all of the input buffer circuits 72-1 to 72-(m−1) except one input buffer circuit 72-m output "L" level signal after the previous "H" level signal and only the input buffer circuit 72-m maintains its "L" level output signal.

For example, in such situation (in negative logic), all of the input buffer circuits 72-1 to 72-m were connected to the common ground line 38-4 via each of the third NMOS transistor 92 in the previous interval that the "L" level input signal was applied to the input terminal 74-1. Then the input buffer circuits 72-1 to 72-(m−1) received "H" level signal at their input terminals and their second NMOS transistor 94 turned "ON" after a predetermined interval defined by the first delay circuit. Now, the second NMOS transistor 92 turns "OFF" after another predetermined interval defined by the second delay circuit 90. As a result, connection to the common ground line 38-3 is transferred to the common ground line 38-4.

Further, only the input buffer circuit 72-m maintains its "L" level output and connection to the common ground line 38-3 via the third NMOS transistor 92.

Therefore, positive electric charges on the input signal line 80-1 which have been charged during the previous "H" level status will be conducted into the common ground line 38-4 during a delay interval defined by the first delay circuit 94.

The summary of those operations of this embodiment is as follows:

(1) If the input signal at 74-1 maintains its "H" level, the common ground line 38-4 is continuously connected via FET 94 to the input buffer circuit 72-1. Line 80-1 is low.

(2) If the input signal maintains its "L" level, the common ground line 38-3 is continuously connected via FET 92 to the input buffer circuit 72-1. Since FET transistor 82-1 is OFF, line 80-1 is high.

(3) If the input signal varies from "H" level to "L" level, the connection between the common ground line 38-4 and the input buffer circuit 72-1 will be changed to a connection between the common ground line 38-3 and the input buffer circuit 72-1.

(4) If the input signal varies from "L" level to "H" level, the connection between the common ground line 38-3 and the input buffer circuit 72-1 will be changed to a connection between the common ground line 38-4 and the input buffer circuit 72-1.

As explained in the previous embodiment of the output buffer circuit, the object of the first and second delay circuits is to avoid the disconnection of the input line 80-1 to any ground lines during above mentioned transitions.

Therefore, the input buffer circuits according to the present invention can isolate common ground lines, one of which is connected to one group of input buffer circuits which should maintain their signal status and the other of which is connected to the other group of input buffer circuits which should vary their signal status.

Therefore, inductive noises caused by such level changes can be effectively isolated from each other with very little additional circuitry.

Of course, the above mentioned embodiments can accept minor modifications such as easing another type of transistor, another type of delay, circuit, or another type of logic status a without changing the scope of the present invention. Further, the present invention has potential technical fields, such as a gate array circuit which has a lot of voltage source lines therein, a high-speed microprocessor having many a input/output buffer circuits, a high-speed semiconductor memory having many input/output buffer circuits, or other logic circuits which need high-speed and high-current buffers.

What is claimed is:

1. A circuit comprising:
   a first conductive line for receiving and applying a first electric potential;
   a second conductive line for receiving and applying a second electric potential;
   a third conductive line, distinct from said second conductive line, for receiving and applying said second electric potential;
   first, second, third and fourth transistors each having a respective path of controllable conductivity between first and second electrodes and each having a respective gate electrode;
   the first electrode of said first transistor being coupled to said first conductive line;
   the first electrode of said second transistor being coupled to the second electrode of said first transistor through a first node, the second electrode of said second transistor being coupled to a second node;
   the first electrode of said third transistor being coupled to said second node, the second electrode of said third transistor being coupled to said second conductive line;
   the first electrode of said fourth transistor being coupled to said second node, the second electrode of said fourth transistor being coupled to said third conductive line;
   a control circuit responsive to an input signal having a first and second logic level, said control circuit being coupled to the gate electrodes of said first, second, third and fourth transistors, for controlling the respective controllable conductive paths of each of said first, second, third and fourth transistors so as to produce an output signal substantially having the first or second electric potentials from said first node; and said control circuit further controlling said transistors such that the third transistor is conducting prior to the input signal being changed from the first logic level to the second logic level until the output signal is substantially changed from the first electric potential to the second electric potential, and such that the fourth transistor is changed to a conductive state after the output signal is substantially changed from the first electric potential to the second electric potential.

2. The circuit according to claim 1 wherein said control circuit includes a first delay circuit coupled to receive the input signal, said first delay circuit effective to output a first delayed signal corresponding to the input signal a first period of time after the receipt of the input signal, and wherein said fourth transistor is responsively coupled to said first delay circuit.

3. The circuit according to claim 2 wherein said first period of time is set so that said fourth transistor is changed from a relatively non-conductive state to a relatively conductive state after the output signal is substantially changed from the first electric potential to the second electric potential.

4. The circuit according to claim 3 wherein said fourth transistor is coupled to receive the first delayed signal at its gate electrode through an inverter.

5. The circuit according to claim 3 wherein said control circuit further includes a second delay circuit having an input coupled to receive the first delayed signal, said second delay circuit is effective to output a second delayed signal corresponding to the first delayed signal a second period of time after the receipt of the first delayed signal at said input of said second delay circuit; and wherein said third transistor is responsively coupled to said second delay circuit.

6. The circuit according to claim 5 wherein said second period of time is set so as to prevent the first node from being electrically disconnected from both said second and third conductive lines when said second transistor is conducting.

7. The circuit according to claim 6 wherein said third transistor is coupled to receive the second delayed signal at its gate electrode.

8. A circuit comprising:
a first conductive line for receiving and applying a first electric potential;
a second conductive line for receiving and applying a second electric potential;
a third conductive line, distinct from said second conductive line, for receiving and applying said second electric potential;
first, second, third and fourth transistors each having a respective path of controllable conductivity between first and second electrodes and each having a respective gate electrode; said first transistor being of a first conductivity type and said second, third and fourth transistors being of a second conductivity type;
the first electrode of said first transistor being coupled to said first conductive line;
the first electrode of said second transistor being coupled to the second electrode of said first transistor through a first node, the second electrode of said second transistor being coupled to a second node;
the first electrode of said third transistor being coupled to said second node, the second electrode of said third transistor being coupled to said second conductive line;
the first electrode of said fourth transistor being coupled to said second node, the second electrode of said fourth transistor being coupled to said third conductive line;
a control circuit responsive to an input signal having first and second logic levels, said control circuit being coupled to the gate electrodes of said first, second, third and fourth transistors, for controlling the respective controllable conductive paths of each of said first, second, third and fourth transistors so as to produce an output signal substantially having a first or second electric potentials from said first node; and
said control circuit further controlling the transistors such that the third transistor is conducting prior to the input signal changing from the first logic level to second logic level until the output signal is substantially changed from the first electric potential to the second electric potential, and that the fourth transistor is changed to a conductive state after the output signal is substantially changed from the first electric potential to the second electric potential.

9. The circuit according to claim 8 wherein said control circuit includes a first delay circuit coupled to receive the input signal, said first delay circuit effective to output a first delayed signal corresponding to the input signal a first period of time after receipt of the input signal; and wherein said fourth transistor is responsively coupled to said first delay circuit.

10. The circuit according to claim 9 wherein said first period of time is set so that the fourth transistor is changed from a relatively non-conductive state to a relatively conductive state after the output signal is substantially changed from the first electric potential to the second electric potential.

11. The circuit according to claim 10 wherein said fourth transistor is coupled to receive the first delayed signal at its gate electrode.

12. The circuit according to claim 10 wherein said control circuit further includes a second delay circuit having an input coupled to receive the first delayed signal, said second delay circuit is effective to output a second delayed signal opposite to the first delayed signal a second period of time after the receipt of the first delayed signal; and wherein said third transistor is responsively coupled to the second delayed circuit.

13. The circuit according to claim 12 wherein said second period of time is set so as to prevent the first node from being electrically disconnected from both said second and third conductive lines when said second transistor is conducting.

14. The circuit according to claim 13 wherein said third transistor is coupled to receive the second delayed signal at its gate electrode.

15. A circuit comprising:
a first conductive line for receiving and applying a first electric potential;
a second conductive line for receiving and applying a second electric potential;
a third conductive line for receiving and applying a second electric potential;

first, second, third, fourth and fifth transistors each having a respective path of controllable conductivity between first and second electrodes and each having a respective gate electrode; said first transistor being of a first conductivity type and said second, third, fourth and fifth transistors being of a second conductivity type;

the first electrode of said first transistor being coupled to said first conductive line, the second electrode of said first transistor being coupled to the first node;

the first electrode of said second transistor being coupled to the first node, the second electrode of said second transistor being coupled to a second node;

the first electrode of said third transistor being coupled to said second node, the second electrode of said third transistor being coupled to said second conductive lines;

the first electrode of said fourth transistor being coupled to the first node, the second electrode of said fourth transistor being coupled to a third node;

the first electrode of said fifth transistor being coupled to said third node, the second electrode of said fifth transistor being coupled to said third conductive line;

a control circuit, responsive to an input signal having a first and second logic level, said control circuit being coupled to the gate electrodes of said first, second, third, fourth and fifth transistors, for controlling the respective conductive paths of said first, second, third, fourth and fifth transistors so as to produce an output signal substantially having the first or second electric potentials from said first node; and said control circuit further controlling the transistors such that one of said second and third transistor is conducting prior to the input signal being changed from the first logic level to second logic level until the output signal is substantially changed from the first electric potential to the second electric potential, and that one of the fourth and fifth transistor is changed from a relatively non-conducting state to a relatively conducting state after the output signal is substantially changed from the first electric potential to the second electric potential.

16. The circuit according to claim 15 wherein said control circuit includes a first delay circuit coupled to receive the input signal, said first delay circuit effective to output a first delayed signal corresponding to the input signal a first period of time after the receipt of the input signal; and wherein one of said fourth and fifth transistors is responsively coupled to the first delayed circuit.

17. The circuit according to claim 16 wherein said first period of time is set so that one of said fourth and fifth transistors is changed from a relatively non-conductive state to a relatively conducting state after the output signal is substantially changed from the first electric potential to the second electric potential.

18. The circuit according to claim 17 wherein one of said fourth and fifth transistors is coupled to receive the first delayed signal at its gate electrode through an invertor.

19. The circuit according to claim 17 wherein said control circuit further includes a second delay circuit having an input coupled to receive the first delayed signal, said second delay circuit outputting a second delayed signal corresponding to the first delayed signal a second period of time after the receipt of the first delayed signal at said input of said second delay circuit; and wherein one of said second and third transistor is responsively coupled to the second delayed circuit.

20. The circuit according to clad 19 wherein said second period of time set is so as to prevent the first node from being electrically disconnected from both said second and third conductive lines.

21. The circuit according to claim 20 wherein one of said fourth and fifth transistors is coupled to receive the second delayed signal at its gate electrode.

* * * * *